US007745350B2

(12) United States Patent
Wang et al.

(10) Patent No.: US 7,745,350 B2
(45) Date of Patent: Jun. 29, 2010

(54) IMPURITY CONTROL IN HDP-CVD DEP/ETCH/DEP PROCESSES

(75) Inventors: Anchuan Wang, Sunnyvale, CA (US); Young S. Lee, San Jose, CA (US); Manoj Vellaikal, Sunnyvale, CA (US); Jason Thomas Bloking, Mountain View, CA (US); Jin Ho Jeon, San Ramon, CA (US); Hemant P. Mungekar, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/204,523

(22) Filed: Sep. 4, 2008

(65) Prior Publication Data

US 2009/0068853 A1 Mar. 12, 2009

Related U.S. Application Data

(60) Provisional application No. 60/970,884, filed on Sep. 7, 2007.

(51) Int. Cl.
*H01L 21/311* (2006.01)
*H01L 21/3065* (2006.01)
(52) U.S. Cl. ............... 438/788; 438/778; 257/E21.218
(58) Field of Classification Search ........... 438/758, 438/778, 787, 788; 257/E21.218
See application file for complete search history.

(56) References Cited

U.S. PATENT DOCUMENTS 6,071,573 A 6/2000 Koemtzopoulos et al.
6,170,428 B1 1/2001 Redeker et al.

6,479,098 B1 11/2002 Yoo et al.

(Continued)

FOREIGN PATENT DOCUMENTS

CN 1473353 A 2/2004

OTHER PUBLICATIONS

Australian Patent Office Search Report from related SG application, mailed Feb. 12, 2009; Application No. SG 200806501-3, 4 pages.

(Continued)

*Primary Examiner*—Matthew Smith
*Assistant Examiner*—Michele Fan
(74) *Attorney, Agent, or Firm*—Townsend and Townsend and Crew

(57) ABSTRACT

Methods are disclosed of depositing a silicon oxide film on a substrate disposed in a substrate processing chamber. The substrate has a gap formed between adjacent raised surfaces. A first portion of the silicon oxide film is deposited over the substrate and within the gap using a high-density plasma process. Thereafter, a portion of the deposited first portion of the silicon oxide film is etched back. This includes flowing a halogen precursor through a first conduit from a halogen-precursor source to the substrate processing chamber, forming a high-density plasma from the halogen precursor, and terminating flowing the halogen precursor after the portion has been etched back. Thereafter, a halogen scavenger is flowed to the substrate processing chamber to react with residual halogen in the substrate processing chamber. Thereafter, a second portion of the silicon oxide film is deposited over the first portion of the silicon oxide film and within the gap using a high-density plasma process.

12 Claims, 5 Drawing Sheets

U.S. PATENT DOCUMENTS

| | | | |
|---|---|---|---|
| 6,584,987 | B1 | 7/2003 | Cheng et al. |
| 6,846,745 | B1 | 1/2005 | Papasouliotis et al. |
| 6,903,031 | B2 * | 6/2005 | Karim et al. ............... 438/787 |
| 7,217,658 | B1 | 5/2007 | Bayman et al. |
| 2003/0216006 | A1 | 11/2003 | Li et al. |
| 2004/0043626 | A1 * | 3/2004 | Chou San et al. ........... 438/758 |
| 2004/0048485 | A1 * | 3/2004 | Min et al. ................... 438/710 |
| 2004/0126952 | A1 | 7/2004 | Gondhalekar et al. |
| 2004/0145029 | A1 | 7/2004 | Adetutu et al. |
| 2004/0166694 | A1 | 8/2004 | Won et al. |
| 2004/0192061 | A1 | 9/2004 | Sasaki et al. |
| 2004/0245091 | A1 * | 12/2004 | Karim et al. ........... 204/192.12 |
| 2005/0103266 | A1 | 5/2005 | Chandran et al. |
| 2005/0124166 | A1 * | 6/2005 | Krishnaraj et al. .......... 438/694 |
| 2005/0136610 | A1 | 6/2005 | Kitagawa et al. |
| 2005/0250340 | A1 | 11/2005 | Chen et al. |
| 2006/0046508 | A1 | 3/2006 | Nemani et al. |
| 2006/0292894 | A1 | 12/2006 | Vellakai et al. |

OTHER PUBLICATIONS

Australian Patent Office Search Report from corresponding SG application, mailed Feb. 12, 2009; Application No. SG 200806500-5, 3 pages.

EP Search Report mailed Aug. 7, 2009; Application No. 08163822.3, 7 pages.

* cited by examiner

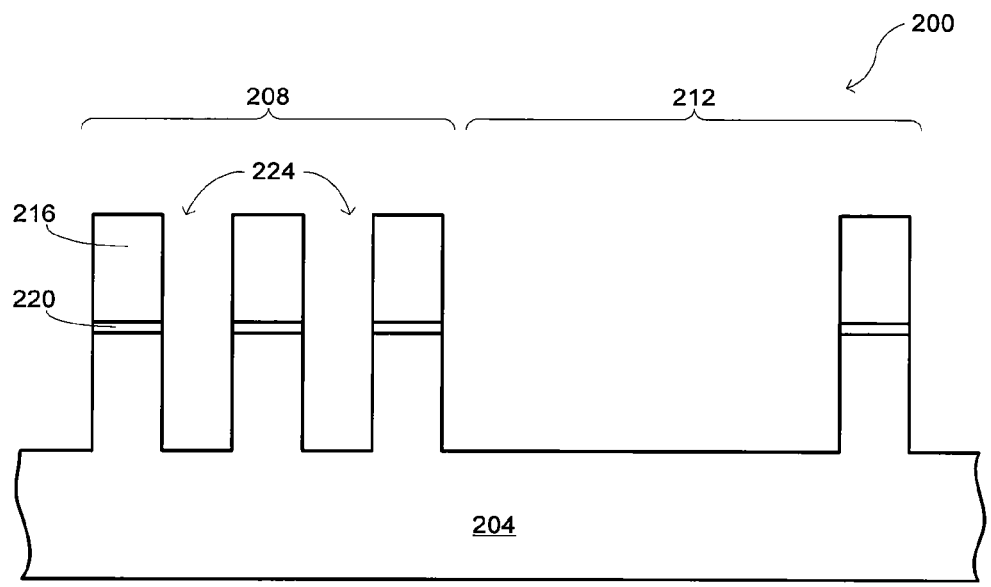
Fig. 2
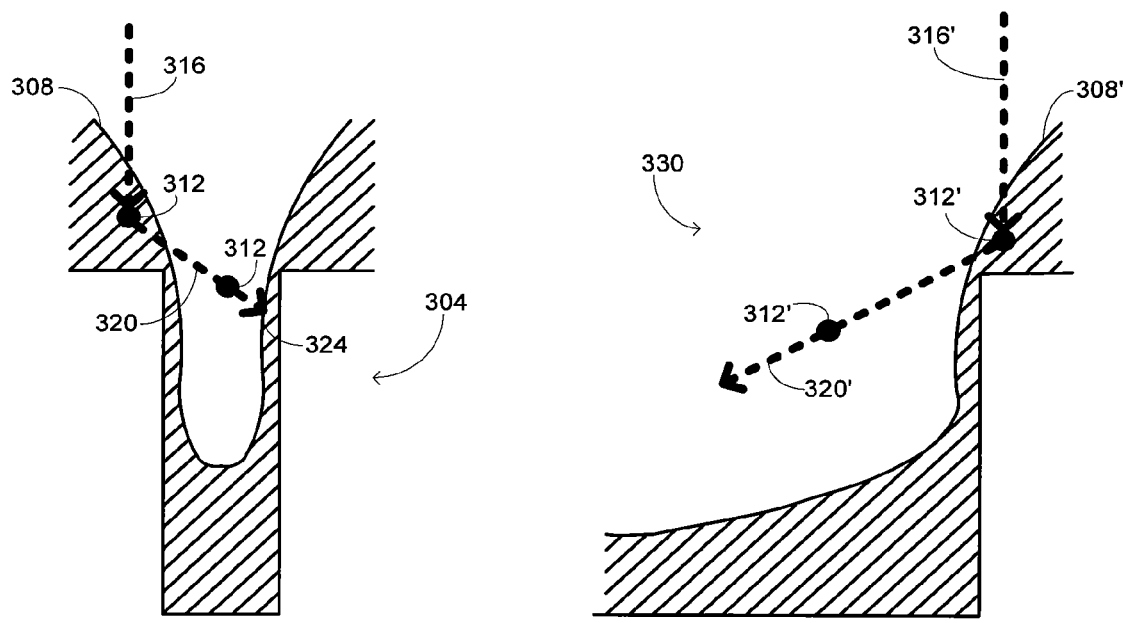
Fig. 3A  Fig. 3B

IMPURITY CONTROL IN HDP-CVD DEP/ETCH/DEP PROCESSES

CROSS REFERENCE TO RELATED APPLICATION

This application is a nonprovisional of, and claims the benefit of the filing date of U.S. Pat. Appl. No. 60/970,884, entitled "INTEGRATED PROCESS MODULATION, filed Sep. 7, 2007 by Anchuan Wang et al., the entire disclosure of which is incorporated herein by reference for all purposes.

This application is also related to concurrently filed, commonly assigned U.S. patent application Ser. No. 12/204,503, entitled "REDUCTION OF ETCH-RATE DRIFT IN HDP PROCESSES" by Anchuan Wang et al. and to U.S. patent application Ser. No. 11/757,637, entitled "GAPFILL EXTENSION OF HDP-CVD INTEGRATED PROCESS MODULATION SIO2 PROCESS," filed Jun. 4, 2007 by Anchuan Wang, the entire disclosure of each of which is incorporated herein by reference for all purposes.

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increasing their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

HDP-CVD systems form a plasma that is at least approximately two orders of magnitude greater than the density of a standard, capacitively coupled plasma CVD system. Examples of HDP-CVD systems include inductively coupled plasma systems and electron cyclotron resonance (ECR) plasma systems, among others. HDP-CVD systems generally operate at lower pressure ranges than low-density plasma systems. The low chamber pressure employed in HDP-CVD systems provides active species having a long mean-free-path and reduced angular distribution. These factors, in combination with the plasma density, contribute to a significant number of constituents from the plasma reaching even the deepest portions of closely spaced gaps, providing a film with improved gapfill capabilities compared with films deposited in a low-density plasma CVD system.

Another factor that allows films deposited by HDP-CVD techniques to have improved gapfill characteristics is the promotion of sputtering by the high density of the plasma, simultaneous with film deposition. The sputtering component of HDP deposition processes slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma towards the substrate. The electric field can be applied throughout the HDP deposition process for further promotion of sputtering and to provide better gapfill characteristics for a given film.

It was initially thought that because of their simultaneous deposition/sputter nature, HDP-CVD processes could fill the gaps or trenches that were created in almost any application. Semiconductor manufacturers have discovered, however, that there is a practical limit to the aspect ratio of gaps that HDP-CVD processes are able to fill. For example, one HDP-CVD process commonly used to deposit a silicon oxide gapfill film forms a plasma from a process gas that includes silane $SiH_4$, molecular oxygen $O_2$, and argon Ar. It has been reported that when such a process is used to fill certain narrow-width high-aspect-ratio gaps, the sputtering caused by argon in the process gas may hamper the gapfill efforts. Specifically, it has been reported that material sputtered by argon in the process redeposits on the upper portions of the sidewalls of the gaps being filled at a rate faster than at the lower portions. This, in turn, may result in the formation of a void in the gap if the upper areas of regrowth join before the gap is completely filled.

FIG. 1 provides schematic cross-sectional views of a silicon oxide film at different stages of deposition to illustrate the potential gapfill limitation associated with some CVD processes. The gapfill problem is illustrated in somewhat exaggerated form to illustrate the problem better. The top portion of FIG. 1 shows the initial structure 104 in which a gap 120 is defined by two adjacent features 124 and 128 having horizontal surfaces 122, with the horizontal surface at the bottom of the gap being denoted 132. As shown in structure 108, i.e. the second portion of the figure from the top, a conventional HDP-CVD silicon oxide deposition process results in direct deposition on the horizontal surface 132 at the bottom of the gap 120 and on the horizontal surfaces 122 above the features 124 and 128. It also, however, results in indirect deposition (referred to as "redeposition") on the sidewalls 140 of the gap 120 due to recombination of material sputtered from the silicon oxide film as it grows. In certain small-width, high-aspect-ratio applications, the continued growth of the silicon oxide film results in formations 136 on the upper section of the sidewall 140 that grow towards each other at a rate of growth exceeding the rate at which the film grows laterally on the lower portions of the sidewall. This trend is shown in structures 108 and 112, with the final result in structure 116 being the formation of a void 144 within the film. The probability of forming a void is very directly related to the rate and character of the redeposition.

There accordingly remains a general need in the art for improving gapfill techniques.

BRIEF SUMMARY OF THE INVENTION

Embodiments of the invention provide methods of depositing a silicon oxide film on a substrate disposed in a substrate processing chamber. The substrate has a gap formed between adjacent raised surfaces. A first portion of the silicon oxide film is deposited over the substrate and within the gap using a high-density plasma process. Thereafter, a portion of the deposited first portion of the silicon oxide film is etched back. This comprises flowing a halogen precursor through a first conduit from a halogen-precursor source to the substrate processing chamber, forming a high-density plasma from the halogen precursor, and terminating flowing the halogen precursor after the portion has been etched back. Thereafter, a halogen scavenger is flowed to the substrate processing chamber to react with residual halogen in the substrate processing chamber. Thereafter, a second portion of the silicon oxide film is deposited over the first portion of the silicon oxide film and within the gap using a high-density plasma process.

The halogen precursor may comprise a fluorine precursor and the halogen scavenger may comprise $O_2$. The first conduit may also be flushed with a flow of a gas nonreactive with the halogen precursor, such as with Ar or He. In some instances, a second gas nonreactive with the halogen precursor, such as He, is flowed through a second conduit to the substrate processing chamber different from the first conduit.

The first portion of the silicon oxide film may be deposited by flowing a silicon-containing gas, an oxygen-containing gas, and a fluent gas into the substrate processing chamber. A first high-density plasma is formed from the silicon-containing gas, the oxygen-containing gas, and the fluent gas. The first portion of the silicon oxide film is deposited using the first high-density plasma at a deposition rate between 900 and 6000 Å/min and with a deposition/sputter ratio greater than 20. The deposition/sputter ratio is defined as a ratio of a net deposition rate and a blanket sputtering rate to the blanket sputtering rate. The silicon-containing gas may comprise $SiH_4$ and the oxygen-containing gas may comprise $O_2$.

The high-density plasma formed from the halogen precursor may be formed by inductively coupling a source radio-frequency power into the substrate processing chamber, with the source radio-frequency power providing a power density on the substrate between 85,000 and 140,000 W/m$^2$. The source radio-frequency power may be provided by sources disposed at a top of the substrate processing chamber and at a side of the substrate processing chamber. The power provided by the source disposed at the side of the substrate processing chamber may, in some embodiments, be greater than the power provided by the source disposed at the top of the substrate processing chamber. In one embodiment the power provided by the source disposed at the side of the substrate processing chamber is at least three times the power provided by the source disposed at the top of the substrate processing chamber.

A further understanding of the nature and advantages of the present invention may be realized by reference to the remaining portions of the specification and the drawings.

BRIEF DESCRIPTION OF THE DRAWINGS

FIG. 2 is a simplified cross-sectional view of a partially completed integrated circuit that includes a plurality of shallow-trench-isolation structures;

FIGS. 3A and 3B are schematic diagrams that respectively illustrate gapfill characteristics of densely packed areas and open areas in a structure;

DETAILED DESCRIPTION OF THE INVENTION

Figure 1:
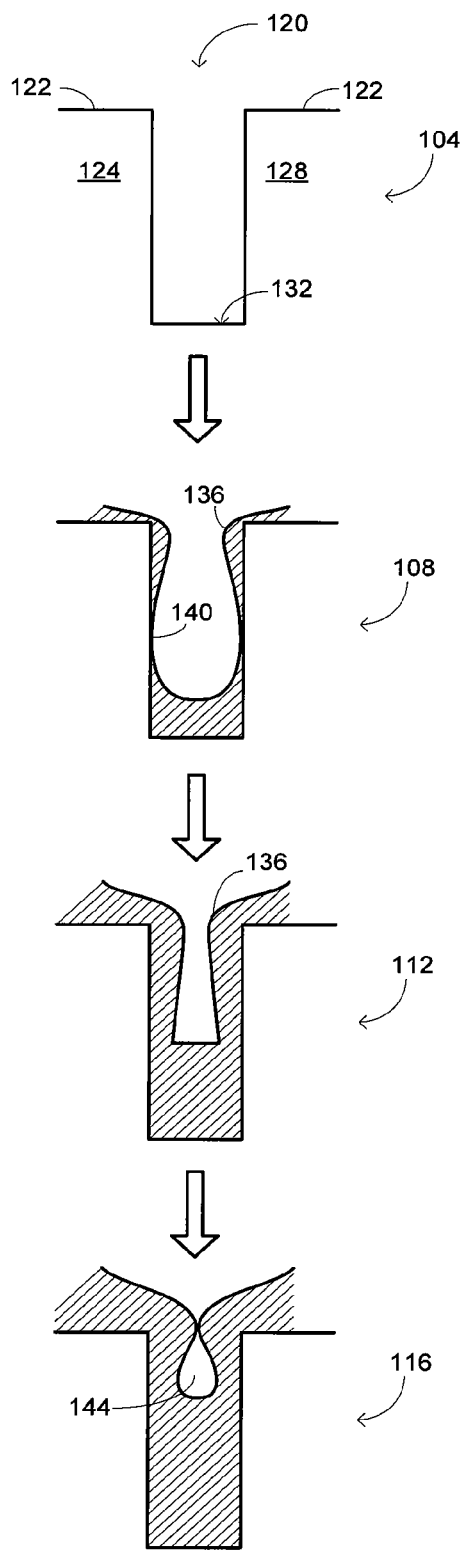
FIG. 1 provides schematic cross-sectional drawings illustrating the formation of a void during a prior-art gapfill process.

Embodiments of the invention are directed to methods of depositing a silicon oxide layer to fill a gap in a surface of a substrate using a high-density-plasma CVD process. Silicon oxide films deposited according to the techniques of the invention have excellent gapfill capabilities and are able to fill gaps encountered in, for example, shallow-trench-isolation ("STI") structures. Films deposited by the methods of the invention are thus suitable for use in the fabrication of a variety of integrated circuits, including those that have a feature size on the order of or less than 45 nm. Part of the method aids in the control of impurities being incorporated into the deposited films.

The types of structures that may be filled according to embodiments of the invention are illustrated by FIG. 2, which provides a simplified cross-sectional view of a partially completed integrated circuit 200. This integrated circuit is formed over a substrate 204 that includes a plurality of STI structures, each of which is typically created by forming a thin pad oxide layer 220 over the surface of the substrate 204 and then forming a silicon nitride layer 216 over the pad oxide layer 220. The nitride and oxide layers are then patterned using standard photolithography techniques and trenches 224 are etched through the nitride/oxide stack into the substrate 204. FIG. 2 shows that the integrated circuit may comprise areas 208 that are relatively densely packed with transistors or other active devices, and may comprise open areas 212 that are relatively isolated. Active devices in the open areas 212 may be separated from each other by more than an order of magnitude than separations in the densely packed areas 208, but as used herein "open areas" are considered to be areas in which gaps have a width at least five times a width of a gap in a "dense area."

Embodiments of the invention provide methods for filling the trenches 224 with an electrically insulating material such as silicon dioxide using a deposition process that has good gapfill properties. In some instances, prior to the gapfill process, an initial lining layer is deposited over the substrate as an in situ steam generation ("ISSG") or other thermal oxide layer, or perhaps a silicon nitride layer. One benefit to depositing such a liner prior to filling the trenches 224 is to provide appropriate corner rounding, which may aid in avoiding such effects as early gate breakdown in transistors that are formed.

As used herein, a high-density-plasma process is a plasma CVD process that includes simultaneous deposition and sputtering components and that employs a plasma having an ion density on the order of 10$^{11}$ ions/cm$^3$ or greater. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(new deposition rate)} + \text{(blanket sputtering rate)}}{\text{(blanket sputtering rate)}}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and, in some instances, flows of a fluent gas, which may also act as a sputtering agent. The elements comprised by the precursor gases react to form the film with the desired composition. For example, to deposit a silicon oxide film, the precursor gases may include a silicon-containing gas, such as silane $SiH_4$, and an oxidizing gas reactant such as molecular oxygen $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, or even a flow a heavier inert gas, such as Ne, Ar, or Xe. The level of sputtering provided by the different fluent gases is directly related to their atomic mass (or molecular mass in the case of $H_2$), with $H_2$ producing even less sputtering than He. Embodiments of the invention generally provide fluent-gas flows that have an average molecular mass less than 5 amu. This may be achieved by using flows of a single low-mass gas, such as with a flow of substantially pure $H_2$ or with a flow of substantially pure He. Alternatively, flows may sometimes be provided of multiple gases, such as by providing both a flow of $H_2$ and a flow of He, which mix in the HDP-CVD process chamber.

Alternatively, the gas may sometimes be premixed so that a flow of $H_2$/He is provided in a mixed state to the process chamber. It is also possible to provide separate flows of higher-mass gases, or to include higher-mass gases in the premixture, with the relative flow rates and/or concentrations of the premixture being selected to maintain an average molecular mass less than 5 amu.

In high-aspect-ratio structures, the use of relatively high flow rates of low-mass fluent gases has been found generally to improve gapfill capability when compared with the more traditional use of fluent gases such as Ar. This is believed to be a consequence of the reduction in redeposition that is achieved by using He or $H_2$ as a fluent gas so that closure of the gap occurs less quickly. But even with the use of such low-mass fluent gases, there is a risk of corner clipping during deposition. This effect may be understood with reference to FIGS. 3A and 3B, which show the effect of the sputtering component of an HDP process respectively for a gap in a densely packed area and for a gap in an open area.

In particular, the gap 304 in FIG. 3A is a high-aspect-ratio gap, with the material deposited using an HDP-CVD process forming a characteristic cusp structure 308 over the horizontal surfaces. Redeposition occurs as material 312 is sputtered from the cusp 308 in response to the impact of plasma ions along path 316. The sputtered material 312 follows a path 320 that encounters the sidewall 324 on the opposite side of the gap 304. This effect is symmetrical so that as material is sputtered away from the left side of the gap onto the right side, material is also sputtered away from the right side of the gap onto the left side. The redeposition of material protects against excess sputtering resulting in clipping of the corners.

This symmetry is not present in the open areas, as illustrated with the open-area structure 330 shown in FIG. 3B. in this instance, the deposition causes the formation of a similar cusp 308', but when material 312' is sputtered along path 320' in response to the impact of plasma ions along path 316', the opposite side of the gap is too far away for the redeposition to be protective. The corner of the structure in FIG. 3B suffers the same ejection of material as does the corner of the structure in FIG. 3A, without the compensating effect of receiving material sputtered from the opposite side of the gap. As a consequence, there is an increased risk of clipping the corner and damaging the underlying structure.

Figure 4:
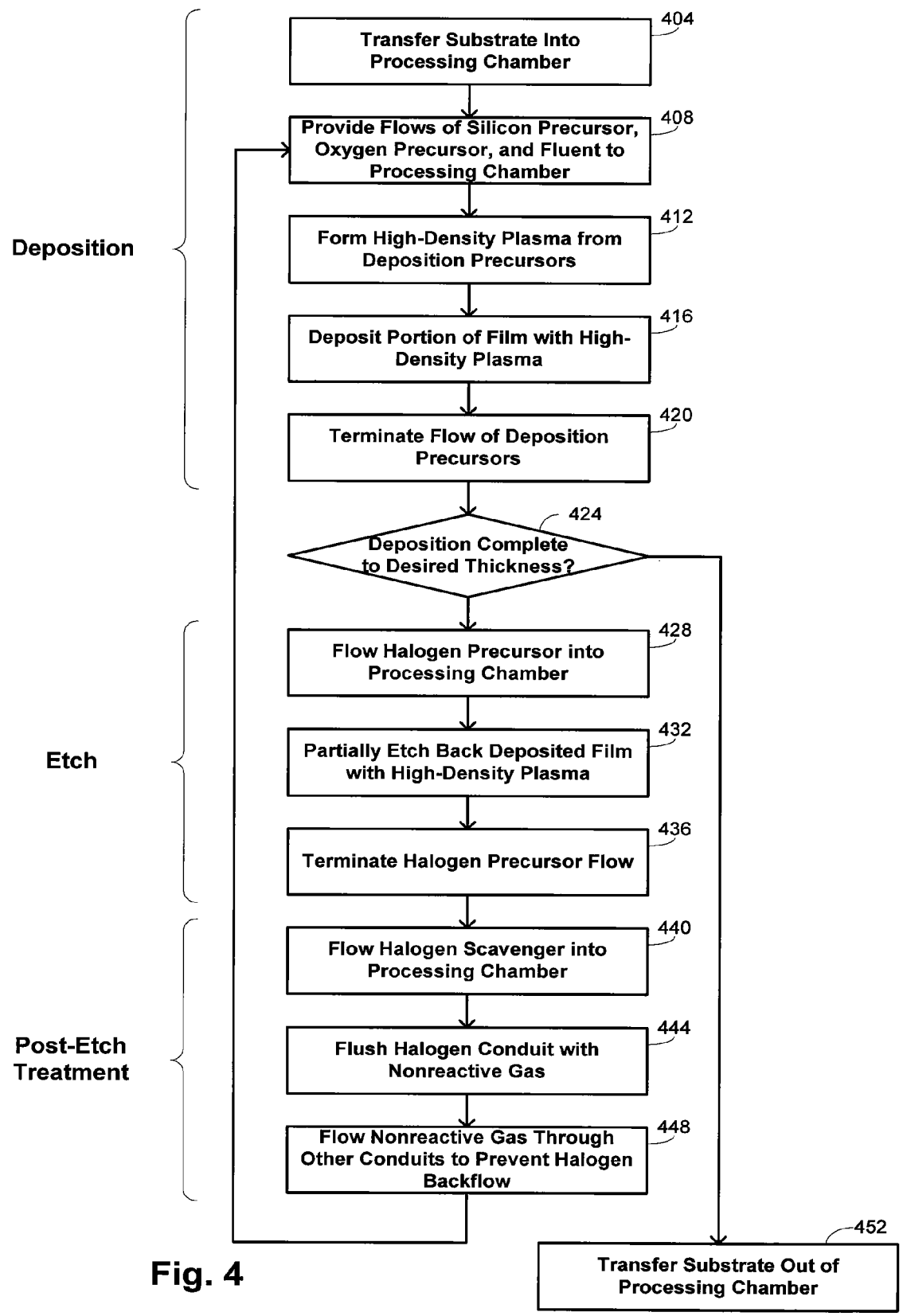
FIG. 4 is a flow diagram summarizing methods for depositing a film in embodiments of the invention.

Methods of the invention are summarized with the flow diagram of FIG. 4. Deposition of a film over a substrate begins at block 404 by transferring the substrate into a process chamber. The substrate is typically a semiconductor wafer, such as a 200-mm or 300-mm-diameter wafer. Flows of precursor gases are provided to the chamber at block 408, including a flow of a silicon precursor, a flow of an oxygen precursor, and a flow of a fluent gas. Table I provides exemplary flow rates for deposition of an undoped silicate glass ("USG") film using flows of monosilane $SiH_4$, molecular oxygen $O_2$, and $H_2$, although it should be understood that other precursor gases, including dopant sources, and other fluent gases may be used as discussed above.

TABLE I

| Exemplary Flow Rates for USG Deposition | | | |
|---|---|---|---|
| Flow Rates for 200-mm Wafer Process | | Flow Rates for 300-mm Wafer Process | |
| $\mathcal{F}(SiH_4)$ | 10-200 sccm | $\mathcal{F}(SiH_4)$ | 10-200 sccm |
| $\mathcal{F}(O_2)$ | 20-300 sccm | $\mathcal{F}(O_2)$ | 20-300 sccm |
| $\mathcal{F}(H_2)$ | 50-400 sccm | $\mathcal{F}(H_2)$ | 50-600 sccm |
| $\mathcal{F}(He)$ | 50-400 sccm | $\mathcal{F}(He)$ | 50-600 sccm |

As the table indicates, the flow rates of the precursor gases may be similar for 200-mm and 300-mm-diameter wafers, but the flow rate of the fluent gas is generally higher.

A high-density plasma is formed from the gaseous flows at block 412 by coupling energy into the chamber. A common technique for generating a high-density plasma is to couple rf energy inductively. The D/S ratio is determined not only by the flow rates for the gases, but also by the power density of energy coupled into the chamber, by the strength of a bias that may be applied to the substrate, by the temperature within the chamber, by the pressure within the chamber, and other such factors.

After completion of the deposition, the flows of the deposition precursors are terminated at block 420 and a check made at block 424 whether the desired thickness of the film has been reached. Embodiments if the invention include at least two deposition stages separated by an etching stage, and may frequently have 5-15 deposition stages or even more deposition stages depending on the specific characteristics of the gap being filled.

An etching phase of the process may begin at block 428 by flowing a halogen precursor, which typically comprises a fluorine precursor such as $NF_3$ or a chlorofluorocarbon. A high-density plasma is formed from the halogen precursor at block 430. In some embodiments, the source power density is between about 80,000 and 140,000 $W/m^2$, which corresponds to a total source power between about 6000 and 10,000 W for a 300-mm-diameter wafer and to a total source power between about 2500 and 4500 W for a 200-mm-diameter wafer. The inventors have found that the use of a high source power causes the deposition profile to be more symmetric than the use of lower source powers. In some embodiments, the total source power is distributed among top and side sources so that a majority of the source power is provided from side sources. For instance, the side source power may be 1-5 times the top source power, with it being three times the top source power in a particular embodiment.

The resulting halogen plasma is used at block 432 to etch back the deposited film. While the specific amount of material that may be etched is relatively dependent on the specific configuration of the substrate structure, it is generally true that the amount of material etched may be greater in later etching cycles than in earlier etching cycles. This is a general consequence of the fact that the overall topology of the substrate changes as a result of the sequence of deposition and etching steps. The general trend with the sequence of steps is that the topology becomes more amenable to greater etch amounts during the etching phase of the cycle. At block 436, the halogen precursor flow is terminated.

This etching phase is then followed with a treatment phase that may include any or all of the processes described in connection with blocks 440, 444, and/or 448. Each of these processes acts to limit incorporation of the halogen into the film. As indicated at block 440, halogen scavenger may be flowed into the processing chamber to react with excess halogen that remains within the processing chamber. A suitable scavenger is $O_2$, although other scavengers may be used in alternative embodiments. At block 444, the halogen conduit to the processing chamber is flushed with a gas that is nonreactive with the halogen precursor, examples of which include Ar and He. Such a nonreactive gas may also be flowed as indicated at block 448 through other conduits to the processing chamber to prevent backflow of the halogen into such conduits.

It is generally expected that the same precursors will be used for deposition of material during each of the deposition phases and that the same precursor will be used for removing material during the etching phase, although this is not a requirement of the invention. The amount of material deposited during each of the deposition phases is typically between 300 and 1000 Å, with the overall process requiring fewer cycles when larger deposition amounts are used per cycle. When each cycle deposits 300 Å, it may be necessary to use about six times as many cycles to deposit the same amount of material as when each cycle deposits 1000 Å.

Once the film has been grown to the desired thickness, the substrate is transferred out of the processing chamber as indicated at block 452.

Exemplary Substrate Processing System

Figure 5A:
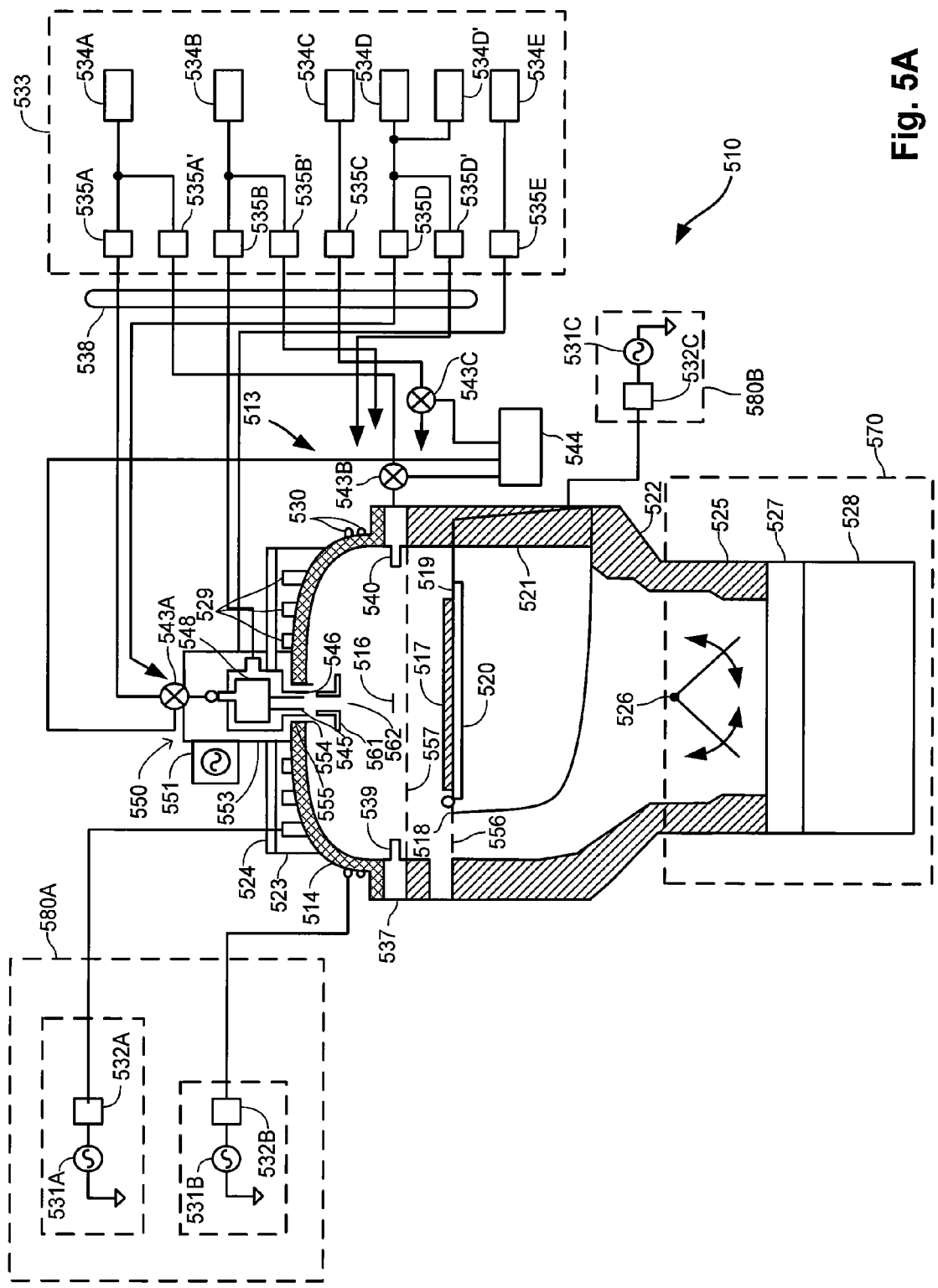
FIG. 5A is a simplified diagram of one embodiment of a high-density-plasma chemical-vapor-deposition system with which methods of the invention may be implemented.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 5A and 5B below. FIG. 5A schematically illustrates the structure of such an HDP-CVD system 510 in one embodiment. The system 510 includes a chamber 513, a vacuum system 570, a source plasma system 580A, a bias plasma system 580B, a gas delivery system 533, and a remote plasma cleaning system 550.

The upper portion of chamber 513 includes a dome 514, which is made of a ceramic dielectric material, such as aluminum oxide or aluminum nitride. Dome 514 defines an upper boundary of a plasma processing region 516. Plasma processing region 516 is bounded on the bottom by the upper surface of a substrate 517 and a substrate support member 518.

A heater plate 523 and a cold plate 524 surmount, and are thermally coupled to, dome 514. Heater plate 523 and cold plate 524 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 513 includes a body member 522, which joins the chamber to the vacuum system. A base portion 521 of substrate support member 518 is mounted on, and forms a continuous inner surface with, body member 522. Substrates are transferred into and out of chamber 513 by a robot blade (not shown) through an insertion/removal opening (not shown) in the side of chamber 513. Lift pins (not shown) are raised and then lowered under the control of a motor (also not shown) to move the substrate from the robot blade at an upper loading position 557 to a lower processing position 556 in which the substrate is placed on a substrate receiving portion 519 of substrate support member 518. Substrate receiving portion 519 includes an electrostatic chuck 520 that secures the substrate to substrate support member 518 during substrate processing. In a preferred embodiment, substrate support member 518 is made from an aluminum oxide or aluminum ceramic material.

Vacuum system 570 includes throttle body 525, which houses twin-blade throttle valve 526 and is attached to gate valve 527 and turbo-molecular pump 528. It should be noted that throttle body 525 offers minimum obstruction to gas flow, and allows symmetric pumping. Gate valve 527 can isolate pump 528 from throttle body 525, and can also control chamber pressure by restricting the exhaust flow capacity when throttle valve 526 is fully open. The arrangement of the throttle valve, gate valve, and turbo-molecular pump allow accurate and stable control of chamber pressures up to about 1 millitorr to about 2 torr.

The source plasma system 580A includes a top coil 529 and side coil 530, mounted on dome 514. A symmetrical ground shield (not shown) reduces electrical coupling between the coils. Top coil 529 is powered by top source RF (SRF) generator 531A, whereas side coil 530 is powered by side SRF generator 531B, allowing independent power levels and frequencies of operation for each coil. This dual coil system allows control of the radial ion density in chamber 513, thereby improving plasma uniformity. Side coil 530 and top coil 529 are typically inductively driven, which does not require a complimentary electrode. In a specific embodiment, the top source RF generator 531A provides up to 2,500 watts of RF power at nominally 2 MHz and the side source RF generator 531B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 580B includes a bias RF ("BRF") generator 531C and a bias matching network 532C. The bias plasma system 580B capacitively couples substrate portion 517 to body member 522, which act as complimentary electrodes. The bias plasma system 580B serves to enhance the transport of plasma species (e.g., ions) created by the source plasma system 580A to the surface of the substrate. In a specific embodiment, bias RF generator provides up to 10,000 watts of RF power at a frequency less than 5 MHz, as discussed further below.

RF generators 531A and 531B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 532A and 532B match the output impedance of generators 531A and 531B with their respective coils 529 and 530. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 5B:
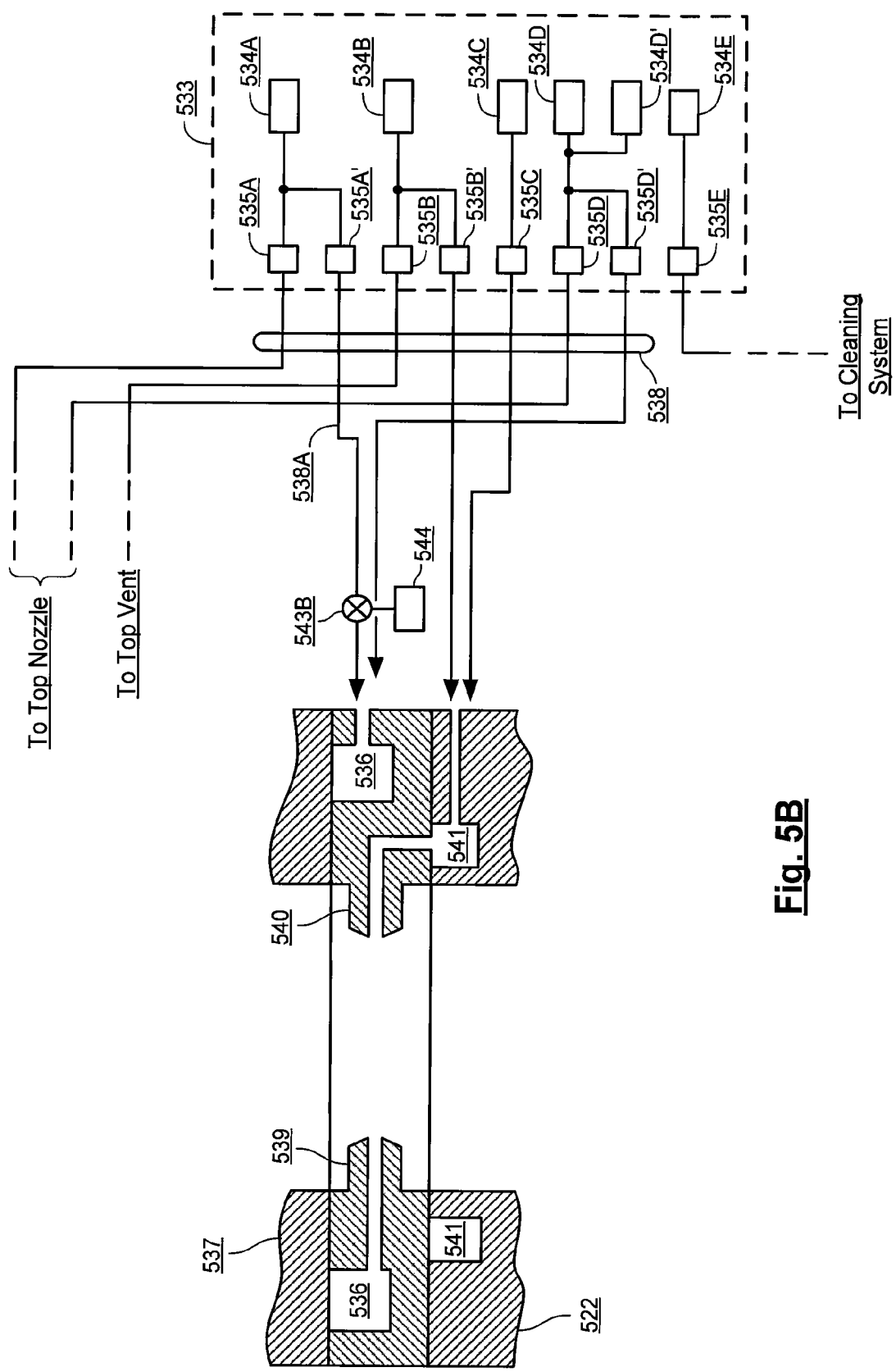
FIG. 5B is a simplified cross section of a gas ring that may be used in conjunction with the exemplary processing system of FIG. 5A.

A gas delivery system 533 provides gases from several sources, 534A-534E chamber for processing the substrate via gas delivery lines 538 (only some of which are shown). As would be understood by a person of skill in the art, the actual sources used for sources 534A-534E and the actual connection of delivery lines 538 to chamber 513 varies depending on the deposition and cleaning processes executed within chamber 513. Gases are introduced into chamber 513 through a gas ring 537 and/or a top nozzle 545. FIG. 5B is a simplified, partial cross-sectional view of chamber 513 showing additional details of gas ring 537.

In one embodiment, first and second gas sources, 534A and 534B, and first and second gas flow controllers, 535A' and 535B', provide gas to ring plenum 536 in gas ring 537 via gas delivery lines 538 (only some of which are shown). Gas ring 537 has a plurality of source gas nozzles 539 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 537 has 12 source gas nozzles made from an aluminum oxide ceramic.

Gas ring 537 also has a plurality of oxidizer gas nozzles 540 (only one of which is shown), which in a preferred embodiment are co-planar with and shorter than source gas nozzles 539, and in one embodiment receive gas from body plenum 541. In some embodiments it is desirable not to mix source gases and oxidizer gases before injecting the gases into chamber 513. In other embodiments, oxidizer gas and source gas may be mixed prior to injecting the gases into chamber 513 by providing apertures (not shown) between body plenum 541 and gas ring plenum 536. In one embodiment, third, fourth, and fifth gas sources, 534C, 534D, and 534D', and third and fourth gas flow controllers, 535C and 535D', provide gas to body plenum via gas delivery lines 538. Additional valves, such as 543B (other valves not shown), may shut off gas from the flow controllers to the chamber. In implementing certain embodiments of the invention, source 534A comprises a silane $SiH_4$ source, source 534B comprises a molecular oxygen $O_2$ source, source 534C comprises a silane $SiH_4$ source, source 534D comprises a helium He source, and source 534D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 543B, to isolate chamber 513 from delivery line 538A and to vent delivery line 538A to vacuum foreline 544, for example. As shown in FIG. 5A, other similar valves, such as 543A and 543C, may be incorporated on other gas delivery lines. Such three-way valves may be placed as close to chamber 513 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 5A, chamber 513 also has top nozzle 545 and top vent 546. Top nozzle 545 and top vent 546 allow independent control of top and side flows of the gases, which improves film uniformity and allows fine adjustment of the film's deposition and doping parameters. Top vent 546 is an annular opening around top nozzle 545. In one embodiment, first gas source 534A supplies source gas nozzles 539 and top nozzle 545. Source nozzle MFC 535A' controls the amount of gas delivered to source gas nozzles 539 and top nozzle MFC 535A controls the amount of gas delivered to top gas nozzle 545. Similarly, two MFCs 535B and 535B' may be used to control the flow of oxygen to both top vent 546 and oxidizer gas nozzles 540 from a single source of oxygen, such as source 534B. In some embodiments, oxygen is not supplied to the chamber from any side nozzles. The gases supplied to top nozzle 545 and top vent 546 may be kept separate prior to flowing the gases into chamber 513, or the gases may be mixed in top plenum 548 before they flow into chamber 513. Separate sources of the same gas may be used to supply various portions of the chamber.

A remote microwave-generated plasma cleaning system 550 is provided to periodically clean deposition residues from chamber components. The cleaning system includes a remote microwave generator 551 that creates a plasma from a cleaning gas source 534E (e.g., molecular fluorine, nitrogen trifluoride, other fluorocarbons or equivalents) in reactor cavity 553. The reactive species resulting from this plasma are conveyed to chamber 513 through cleaning gas feed port 554 via applicator tube 555. The materials used to contain the cleaning plasma (e.g., cavity 553 and applicator tube 555) must be resistant to attack by the plasma. The distance between reactor cavity 553 and feed port 554 should be kept as short as practical, since the concentration of desirable plasma species may decline with distance from reactor cavity 553. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 520, do not need to be covered with a dummy wafer or otherwise protected, as may be required with an in situ plasma cleaning process. In FIG. 5A, the plasma-cleaning system 550 is shown disposed above the chamber 513, although other positions may alternatively be used.

A baffle 561 may be provided proximate the top nozzle to direct flows of source gases supplied through the top nozzle into the chamber and to direct flows of remotely generated plasma. Source gases provided through top nozzle 545 are directed through a central passage 562 into the chamber, while remotely generated plasma species provided through the cleaning gas feed port 554 are directed to the sides of the chamber 513 by the baffle 561.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a silicon oxide film on a substrate disposed in a substrate processing chamber, the substrate having a gap formed between adjacent raised surfaces, the method comprising:

depositing a first portion of the silicon oxide film over the substrate and within the gap using a high-density plasma process;

thereafter, etching back a portion of the deposited first portion of the silicon oxide film, wherein etching back the portion comprises:

flowing a halogen precursor through a first conduit from a halogen-precursor source to the substrate processing chamber;

forming a high-density plasma from the halogen precursor by inductively coupling a source radio-frequency power into the substrate processing chamber, the source radio-frequency power providing a power density on the substrate between 85,000 and 140,000 $W/m^2$; and terminating flowing the halogen precursor after the portion has been etched back;

thereafter, flowing a halogen scavenger to the substrate processing chamber to react with residual halogen in the substrate processing chamber; and thereafter, depositing a second portion of the silicon oxide film over the first portion of the silicon oxide film and within the gap using a high-density plasma process.

2. The method recited in claim 1 wherein the halogen precursor comprises a fluorine precursor and the halogen scavenger comprises $O_2$.

3. The method recited in claim 1 further comprising flushing the first conduit with a flow of a first gas nonreactive with the halogen precursor.

4. The method recited in claim 3 wherein the first gas nonreactive with the halogen precursor comprises Ar.

5. The method recited in claim 3 wherein the first gas nonreactive with the halogen precursor comprises He.

6. The method recited in claim 3 further comprising flowing a second gas nonreactive with the halogen precursor through a second conduit to the substrate processing chamber different from the first conduit.

7. The method recited in claim 6 wherein the second gas nonreactive with the halogen precursor comprises He.

8. The method recited in claim 1 wherein depositing the first portion of the silicon oxide film comprises:

flowing a silicon-containing gas into the substrate processing chamber;

flowing an oxygen-containing gas into the substrate processing chamber;

flowing a fluent gas into the substrate processing chamber;

forming a first high-density plasma from the silicon-containing gas, the oxygen-containing gas, and the fluent gas;

depositing the first portion of the silicon oxide film using the first high-density plasma at a deposition rate between 900 and 6000 Å/min and with a deposition/sputter ratio greater than 20, wherein the deposition/sputter ratio is defined as a ratio of a net deposition rate and a blanket sputtering rate to the blanket sputtering rate.

9. The method recited in claim 8 wherein the silicon-containing gas comprises SiH4 and the oxygen-containing gas comprises $O_2$.

10. The method recited in claim 1 wherein:

the source radio-frequency power is provided by sources disposed at a top of the substrate processing chamber and at a side of the substrate processing chamber; and the power provided by the source disposed at the side of the substrate processing chamber is greater than the power provided by the source disposed at the top of the substrate processing chamber.

11. The method recited in claim 1 wherein the power provided by the source disposed at the side of the substrate processing chamber is at least three times the power provided by the source disposed at the top of the substrate processing chamber.

12. The method recited in claim 1 further comprising:
etching back a portion of the deposited second portion of the silicon oxide film, wherein etching back the portion comprises:
flowing a halogen precursor through the first conduit from the halogen-precursor source to the substrate processing chamber;
forming a high-density plasma from the halogen precursor; and
terminating flowing the halogen precursor after the portion has been etched back;
thereafter, flowing the halogen scavenger to the substrate processing chamber to react with residual halogen in the substrate processing chamber; and
thereafter, depositing a third portion of the silicon oxide film over the second portion of the silicon oxide film and within the gap using a high-density plasma process.

* * * * *